United States Patent [19]

Iwai

[11] Patent Number: 4,500,615
[45] Date of Patent: Feb. 19, 1985

[54] WAFER EXPOSURE METHOD AND APPARATUS

[75] Inventor: Hiroshi Iwai, Tokyo, Japan

[73] Assignee: Tokyo Shibaura Denki Kabushiki Kaisha, Kawasaki, Japan

[21] Appl. No.: 421,070

[22] Filed: Sep. 22, 1982

[30] Foreign Application Priority Data

Sep. 22, 1981 [JP] Japan .................... 56-149866

[51] Int. Cl.³ .................... G03C 5/00; G01B 11/02
[52] U.S. Cl. .................... 430/30; 430/327;
430/394; 356/357; 356/444
[58] Field of Search .................... 430/30, 394, 327;
356/357, 444; 355/53

[56] References Cited

U.S. PATENT DOCUMENTS

| 3,950,170 | 4/1976 | Grosholz | 430/30 |
| 4,083,634 | 4/1978 | Momose et al. | 355/71 |
| 4,308,586 | 12/1981 | Coates | 364/525 |
| 4,388,389 | 6/1983 | Gold | 430/30 |

Primary Examiner—John E. Kittle
Assistant Examiner—José G. Dees
Attorney, Agent, or Firm—Finnegan, Henderson, Farabow, Garrett and Dunner

[57] ABSTRACT

Provided are a wafer exposure method and apparatus wherein a mask of a desired chip pattern is exposed in a reduced scale onto a wafer coated with a resist film, and a number of resist patterns are transferred onto the resist film by the step and repeat method. During the transfer of the resist pattern, the thickness of the resist film is measured, and the exposure is controlled according to the measured thickness of the resist film.

12 Claims, 6 Drawing Figures

F I G. 4
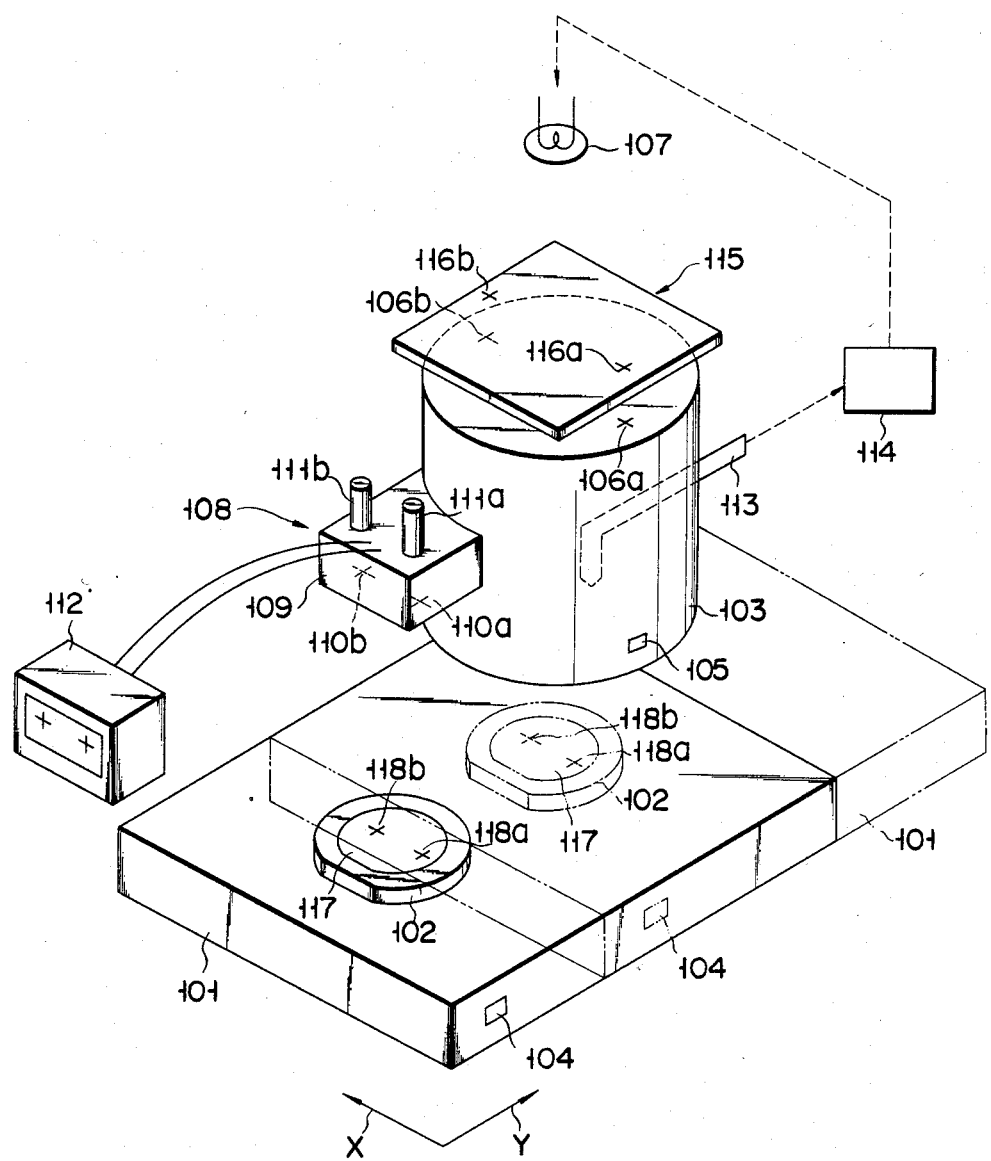

WAFER EXPOSURE METHOD AND APPARATUS

BACKGROUND OF THE INVENTION

This invention relates to a wafer exposure method adopting a step and repeat exposure method of a projection system, particularly a reduction projection system and an apparatus for carrying out the same.

With the progress of high integration LSI techniques, the importance of microlithography is increasing. The precision of microlithography greatly depends upon the performance of the exposure apparatus. Recently, the performance of the exposure apparatus has been strikingly improved, and step and repeat exposure apparatus of projection type, particularly reduction projection type, has been developed and is regarded to be an effective apparatus for lithography of line widths of the order of 1 μm.

FIG. 1 shows the construction of a well-known step and repeat exposure apparatus. Referring to FIG. 1, to the top of a stage 1 which is movable in X- and Y-direction, is secured a wafer chuck 2 for securing a wafer to the stage 1. Above the stage 1, an optical column 3 including an optical system for reducing mask patterns is disposed. The optical column 3 is provided near the edge of its top with two marks 4a and 4b for being aligned with alignment marks of a mask to be described later. Right above the optical column 3, a light source 5 is disposed at a predetermined distance therefrom. Further, the optical column 3 is provided with an alignment system 6 on its side wall. The alignment system 6 includes a body 7 provided at the bottom with marks 8a and 8b for being aligned with the alignment marks of the mask to be described later and microscopes 9a and 9b provided on top of the body 7 for observing the state of alignment with the marks 8a and 8b with the alignment marks of the wafer. In the alignment system 6 of this kind, a mirror or a half mirror may be provided between the marks 8a and 8b and the microscopes 9a and 9b, and by the agency of this mirror or half mirror an alignment monitor 10 for observing the state of alignment between the marks 8a and 8b and the alignment marks of the alignment mask of wafer. The side of the stage 1 and the side of the optical column 3 are provided with marks 11a and 11b for effecting alignment of the two in the Y-direction.

Now, the method of wafer exposure with the reduction projection type step and repeat exposure apparatus described above will be described. The mask 12 is aligned with the optical column 3 by aligning the alignment marks 13a and 13b provided on a mask 12 having a desired mask pattern with the marks 4a and 4b provided on the optical column 3 near the edge of its top. With the reduction projection exposure system described above, the mask pattern of the mask 12 is projected on a reduced scale on a wafer. Therefore, with the reduction of the mask pattern the out-of-alignment between the mask 12 and optical column 3 is also reduced, and thus alignment departure from the alignment between the mask 12 and optical system 3 gives rise to no problem.

After the wafer 14 is secured to the wafer chuck 2, alignment between the wafer 14 and alignment system 6 is effected. More particularly, alignment marks 15a and 15b provided on the wafer 14 are aligned to the marks 8a and 8b of the main body 7 by moving the wafer 14 while observing it with the microscopes 9a and 9b or the alignment monitor 10. The alignment system 6 is secured to the optical column 3 at a predetermined position thereof, and thus the wafer 14 is indirectly aligned to the optical column 3 and mask 4.

After the alignment between the wafer 12 and alignment system 6 has been completed, the stage 1 is moved in the Y-direction along a rail (not shown) to effect alignment between the stage 1 and optical system 3 such that the wafer 14 is positioned directly beneath the optical column 3 as shown by double dot and bar line in FIG. 1. The alignment between the stage 1 and optical column 3 in the Y-direction may be automatically effected with a laser interferometer by making use of the mark 11a of the stage 1 and the mark 11b of the optical column.

After the alignment between the mask 12 and wafer 14 has been obtained, the step and repeat process is effected by moving the wafer 14 in the X- and Y-directions. For every step, light is projected from the light source 5 to illuminate the mask 12, and a reduced-scale pattern 16 of the mask pattern of the mask 12 is repeatedly projected on the wafer 14 as shown in FIG. 2.

After the exposure is ended, the stage 1 is returned to the initial position (i.e., the position at which the alignment between the wafer 14 and alignment system 6 has been effected), and then the wafer is replaced with a new one. Usually, the mask has one or more chip mask patterns, and the number of patterns 16 projected onto the wafer 14 is thus the product of the number of the chips of the mask and the number of times of repeat.

With the step and repeat exposure system as described above, with which the area of the wafer 14 on which light is projected in one shot (i.e., pattern 16) is small, the resolution can be revolutionally improved, compared to a one-to-one projection system.

However, the step and repeat exposure system as described above has the following drawbacks.

As in the case of a one-to-one projection system, it is difficult to expose such that the size of the chip pattern will be within a given tolerance over the entire area of the wafer 14. For example, even if the same mask is used for exposure, a chip pattern of 1.0 μm may be obtained at the center of the wafer 14 while a chip pattern of 1.3 μm may be obtained at the periphery of the wafer 14. This may be attributed to the following reason. When the resist film is rotation-coated onto the wafer 14 by a spinner, the thickness of a resist film 17 on the wafer 14 generally becomes thicker toward the periphery of the wafer 14, as shown in FIG. 3, although this depends on the viscosity of the resist, the rotational frequency of the wafer 14, and so on. For this reason, the resist image may differ from place to place. In addition to the nonuniformity of the thickness of the resist film, the nonuniformity of the resist image may also be attributed to changes in the developing characteristics. The width of the chip pattern is also affected by changes in the degree of side etching which is, in turn, caused by changes in the etching characteristics or thickness of the material to be etched. However, with respect to the etching characteristics, etching methods which do not cause side etching at all or which cause only slight side etching are already available, such as reactive ion etching. Therefore, if such an etching method is adopted, changes in the width of the chip pattern after etching need not be considered. However, the problem of changes in the size of the chip pattern which are attributable to the nonuniformity of the thickness of the resist film remains unsolved.

SUMMARY OF THE INVENTION

It is an object of the present invention to provide a wafer exposure method wherein the resist pattern dimensions may be controlled with high precision from one wafer to another.

It is another object of the present invention to provide a wafer exposure apparatus wherein the resist pattern dimensions may be controlled with high precision from one wafer to another.

According to an aspect of the present invention, there is provided a wafer exposure method comprising the steps of:

measuring a thickness of a portion of a resist film corresponding to a transfer region of a wafer;

exposing said resist film covering said wafer by the step and repeat method to transfer a pattern thereonto; and controlling an exposure on the basis of the thickness of said resist film during transfer of said pattern.

According to another aspect of the present invention, there is also provided a wafer exposure apparatus comprising:

means for measuring a thickness of a portion of a resist film corresponding to a transfer region of a wafer;

means for exposing said resist film covering said wafer by the step and repeat method to transfer a pattern thereonto; and means for controlling an exposure on the basis of the thickness of said resist film during transfer of said pattern.

BRIEF DESCRIPTION OF THE DRAWINGS

FIG. 4 is a perspective view of a step and repeat exposure apparatus of the reduction projection type according to an embodiment of the present invention;

DETAILED DESCRIPTION OF THE PREFERRED EMBODIMENTS

Figure 1:
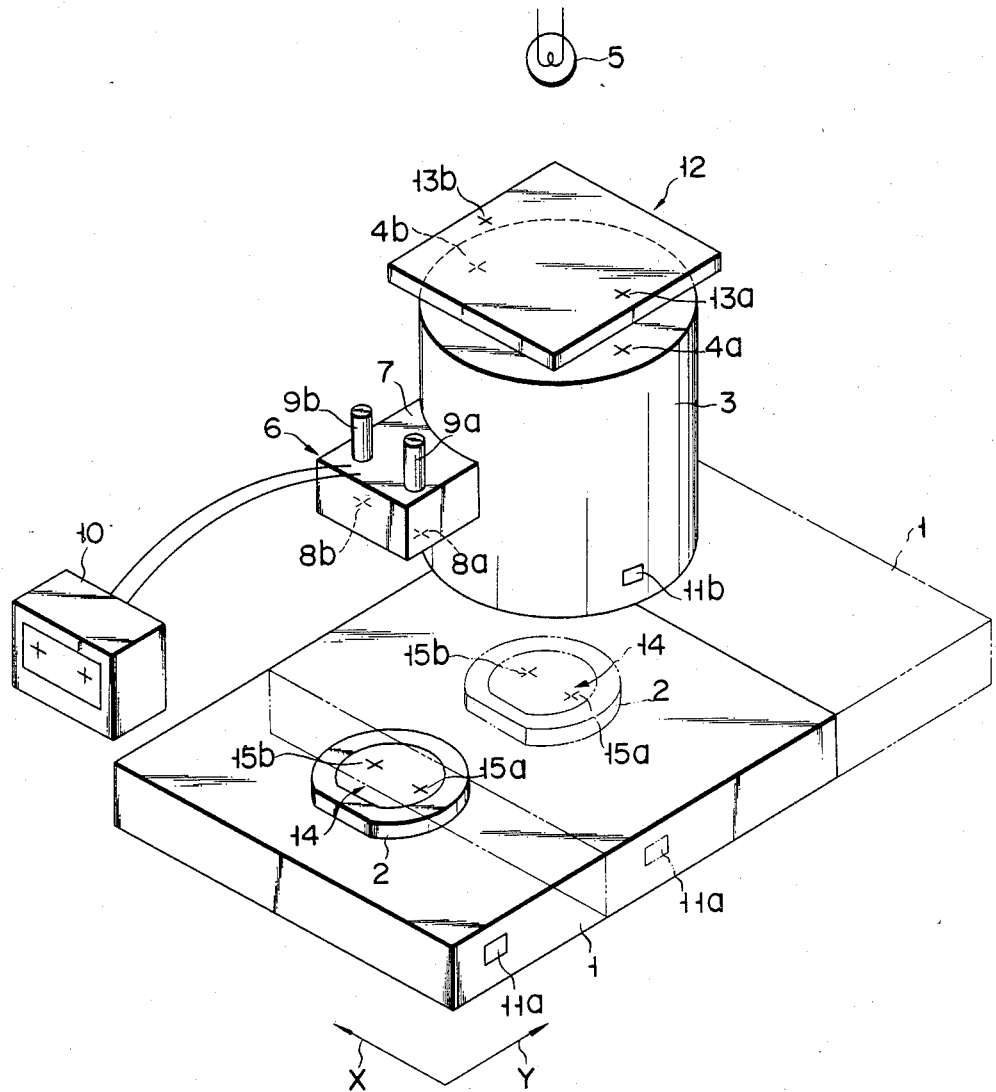
FIG. 1 is a perspective view of a conventional step and repeat exposure apparatus of the reduction projection type.
Figure 2:
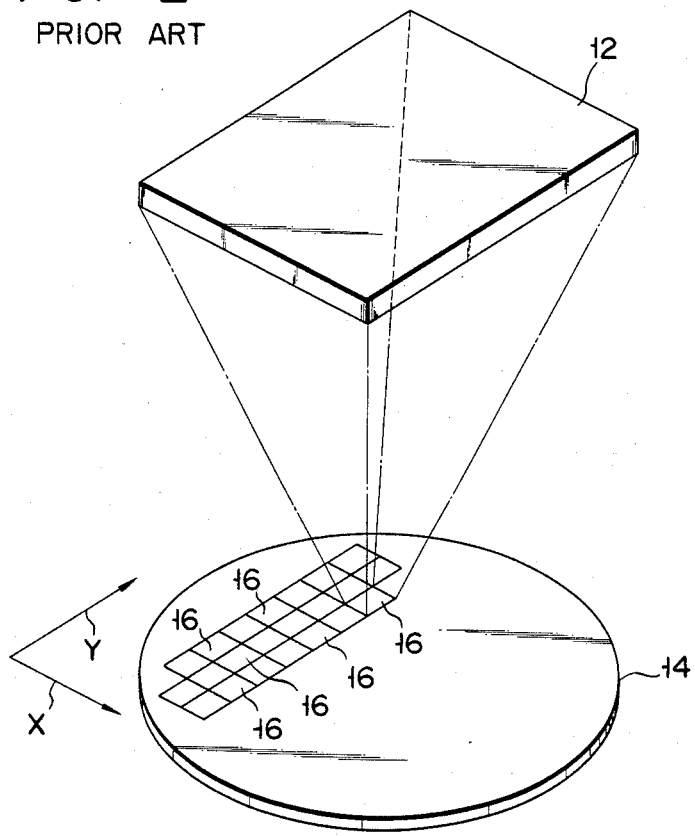
FIG. 2 is a view showing the step and repeat exposure method using the apparatus shown in FIG. 1.
Figure 3:
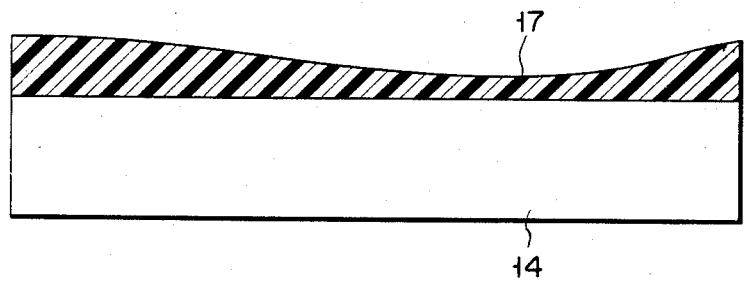
FIG. 3 is a sectional view of a wafer coated with a resist film.

The preferred embodiment of the present invention will now be described with reference to the accompanying drawings.

FIG. 4 is a perspective view showing a step and repeat exposure apparatus of the reduction projection type according to an embodiment of the present invention. The exposure apparatus includes a stage 101 which moves in X- and Y-directions and a wafer chuck 102 which is driven to rotate by a motor or the like. An optical column 103 incorporating an optical system for reducing the pattern in scale is arranged above the stage 101. Marks 104 and 105 are respectively formed on the side surfaces of the stage 101 and the optical column 103 so as to allow alignment thereof in the Y-direction. Marks 106a and 106b of a cross-shape are formed at the periphery of the top surface of the optical column 103 so as to be aligned with the marks of a mask (to be described later). A light source 107 is arranged immediately above the optical column 103 with a predetermined distance therebetween. An alignment system 108 is mounted on the side surface of the optical column 103. The alignment system 108 comprises a body 109 which is mounted on the side surface of the optical column 103, marks 110a and 110b of a cross-shape for alignment with the marks of the wafer which are formed on the bottom surface of the body 109, and microscopes 111a and 111b which are mounted on the body 109 and which allow observation of alignment between the marks of the wafer and the marks 110a and 110b. The alignment system 108 may further include a half mirror (not shown) or a mirror which is interposed between the marks 110a and 110b and the microscopes 111a and 111b on the body 109, and an alignment monitor 112 for monitoring the alignment between these marks. A resist film thickness meter 113 is also mounted on the side surface of the optical column 103 for measuring the thickness of the resist film portion corresponding to the transfer region i.e., a chip forming region, of the wafer before the step operation of the wafer and after the exposure. The resist film thickness meter 113 is such a double beam interferometer as disclosed in U.S. Pat. No. 4,147,435. It measures the thickness of the resist film 17 in the following manner. First, a monochromic light beam such as a laser beam is split into two beams. These beams are applied onto the wafer 14 at right angles thereto. The beam reflected from the surface of the wafer 14 and the beam reflected from the surface of the resist film 17 are synthesized into one light beam. The light waves interfere with each other, thus forming interference fringes. From these interference fringes the thickness of the resist film 17 is detected. Since the photographic sensitivity of the resist film depends upon the wavelength, a laser beam of short wavelength such as 9,000 Å is used so that the resist film will not be exposed at this time. A light source such as a mercury lamp is selected for exposure which has a long wavelength such as 4,000 Å which matches the peak of the photographic sensitivity of the resist film. The light beam from the resist film thickness meter 113 may be applied to a surface area of the resist film 17 which is not large enough to cause an erroneous drawing of a pattern on the wafer 14. In this case the limited portion of the resist film 17 is exposed to light, but this makes no problem. The measurement result from the resist film thickness meter 113 is supplied to a control system 114 comprising, for example, a computer. On the basis of the input measurement result, and the type of the resist, the developing characteristics, the etching characteristics and so on that are set in advance, the control system 114 controls the exposure output to thereby control the exposure during the exposure operation of the light source 107. For this purpose, the optimal exposure which corresponds to each resist film thickness is determined by experiment and is stored in the memory of the computer. Thus, the control system 114 compares the measurement result with the pre-stored data by the CPU to provide the exposure, and produces a control signal from its output port. The control signal opens/closes a shutter mechanism comprising a mechanical means or controls the ON time or power of the light source.

The exposure method of the wafer by the step and repeat exposure apparatus will now be described.

Marks 116a and 116b of a cross-shape on a chip forming mask 115 having a pattern of a desired element or field are aligned with the marks 106a and 106b at the periphery of the top surface of the optical column 103. A wafer 117 coated with a resist film 119 is assembled in the wafer chuck 102. The wafer chuck 102 is rotated and/or the stage 101 is moved in the X- and Y-directions so as to align the marks 110a and 110b of the body 109 with the marks 118a and 118b formed on the wafer 117 while monitoring the alignment through the microscopes 111a and 111b of the alignment system 108 mounted on the optical column 103. Alternatively, the wafer chuck 102 or the stage 101 is moved so as to align the marks 110a and 110b of the body 109 with the marks 118a and 118b of the wafer 117 while monitoring through the alignment monitor 112. Since the alignment system 108 is fixed to the optical column 103, the wafer 117 is aligned with the optical column 103 and the chip forming mask 115. Thereafter, the stage 101 is moved in the Y-direction along a rail (not shown) to locate the wafer 117 immediately below the optical column 103 as indicated by the virtual line shown in FIG. 4. The alignment between the stage 101 and the optical column 103 is performed automatically by a laser interferometer utilizing the marks 104 and 105 formed on the stage 101 and the optical column 103, respectively. Subsequently, the wafer 117 is step-and-repeated together with the stage 101 in the X- and Y-directions. After the step operation and before irradiation of the resist film portion corresponding to the transfer region of the wafer 117 with light from the light source 107, the thickness of this resist film portion is measured. The measurement is fed back to the light source 107 through the control system 114 so as to subject the mask 115 to the optimal exposure for the measured resist film thickness. The exposed pattern is reduced in scale by the optical column 103 to transfer the chip pattern of the wafer 117 onto the resist film 119.

Figure 5:
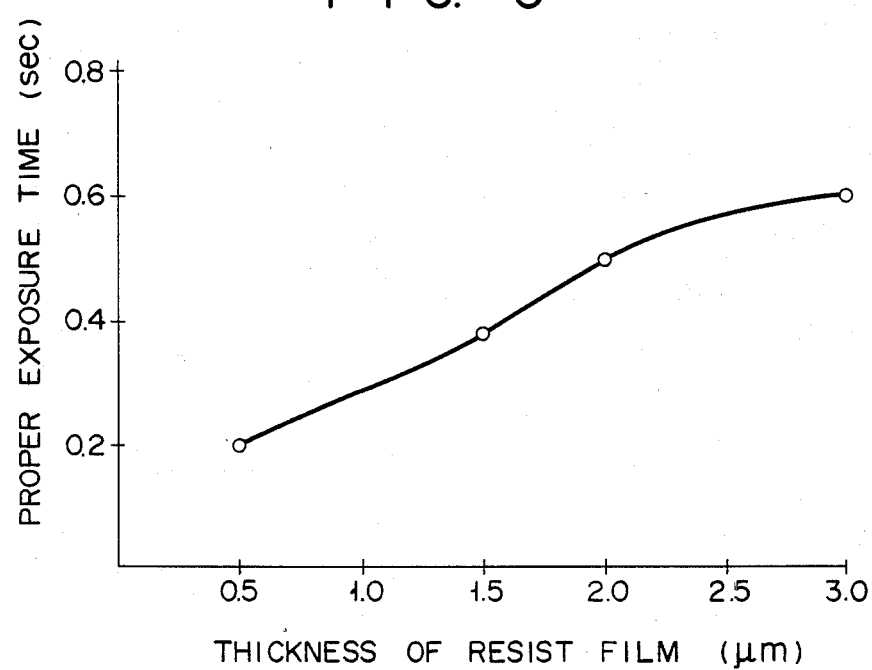
FIG. 5 is a graph showing the proper exposure time (sec) as a function of the thickness of a resist film ($\mu$m)
Figure 6:
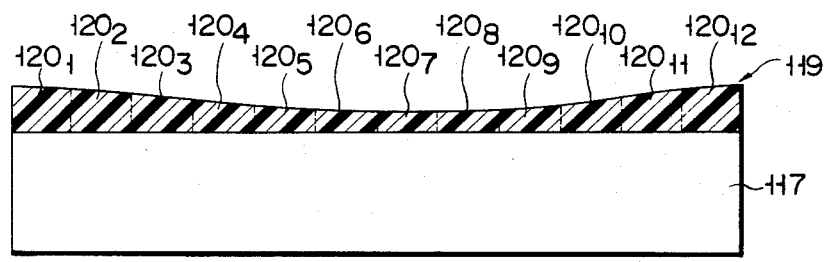
FIG. 6 is a sectional view for explaining control of the exposure of the wafer coated with the resist film.

FIG. 5 is a graph showing the proper exposure time (sec) as a function of the resist film thickness (μm). The proper exposure time increases with an increase in the resist film thickness. The proper exposure time is the exposure time which is required to transfer the mask so as to obtain chip patterns of uniform dimensions independently of the resist film thickness. The exposure is controlled such that the exposure from the light source 107 is increased at a thick resist film portion such as a transfer region $120_1$ of a resist film 119 on the wafer 117 (FIG. 6), and the exposure is decreased at a thin resist film portion such as a transfer region $120_6$ of the resist film 119. When such control is performed, the pattern width of the same portion of each resist pattern will be the same. Then, after the stage 101 is stepped to the next transfer region, measurement of the resist film and exposure (pattern transfer) by the light from the light source 107, which is controlled to effect the proper exposure time, are repeated.

Based on the fact that exposure is performed for each step by the step and repeat method, unlike the one-to-one projection method, the present invention provides a wafer exposure method wherein the thickness of the resist film portion on the wafer for transfer is measured after the step operation and before the exposure, and the measurement is fed back to the light source through the control system or the like to control the exposure, so that a resist pattern of uniform size may be formed on the wafer independently of changes in the resist film thickness, thereby allowing manufacture of a micronized LSI.

In the embodiment described above, the exposure is controlled on the basis of the measurement of the thickness of the resist film on the wafer which is obtained after the step operation and before the exposure operation. However, the present invention is not limited to this. For example, the exposure may be controlled by the following method. First, photoresist is coated on a test wafer under specific conditions. The thickness of the resist film portion for transfer is then measured. From the thickness thus measured an optimum exposure is determined, and the data representing the optimum exposure is stored into a memory included in the control system. The data is used to determine an optimum exposure for the transfer portion of a resist film which has been coated on a wafer under said specific conditions. This method is advantageous in that the thickness of only the resist film coated on the test wafer needs to be measured and that the thickness of the resist film on any product wafer need not be measured. This helps to enhance the productivity of the mask making very much.

It is preferred that the exposure be controlled according to not only the thickness of a resist film but also the physical properties of the film such as development characteristic or etching characteristic. If different resists are used, an optimum exposure for each resist film is determined by experiments, and data representing the optimum exposure is then stored into a memory included in the control system.

There are cases where developing progresses faster at the periphery of the wafer than at the other portions thereof so that the resist pattern tends to become thinner at the periphery of the wafer. In such a case, in addition to the data on the thickness of the resist film, the developing characteristics may also be determined by experiment and the exposure may be controlled according to the resist film thickness and the developing characteristics determined in this manner.

This is also applicable to the etching characteristics. For example, there are cases where after etching, the resist film at the periphery may become thinner by side etching or the like. In such a case, the exposure may be controlled according to the resist film thickness and the etching characteristics.

Since the thickness of the resist film pattern is also affected by the light reflected from the film on the wafer, the amount of reflected light from the film ($SiO_2$, Al, $Si_3N_4$ or the like) may be measured, and the exposure may be controlled according to the resist film thickness and the amount of reflected light.

The thickness of the resist film may not be measured for every transfer portion. Only those of transfer portions which represent a sufficiently clear distribution of thickness of the resist film may be subjected to thickness measuring.

What is claimed is:

1. A wafer exposure method comprising the steps of:
   measuring the thicknesses of a portion of a resist film for each of a plurality of separate and discrete chip forming regions of a wafer;
   exposing said resist film covering said wafer by a step and repeat method to transfer a pattern to each of the chip forming regions; and
   controlling the exposure of said chip forming regions on the basis of the measured thickness of said resist film of the chip forming region being exposed during transfer of said pattern.

2. A method according to claim 1, wherein the thickness of said resist film is measured by sensing a phase difference of reflected light when said wafer is irradiated with light.

3. A method according to claim 1, wherein the exposure of said resist film on said wafer is controlled in accordance with a measured thickness of said resist film and with developing characteristics of said resist film.

4. A method according to claim 1, wherein the exposure of said resist film on said wafer is performed in accordance with a measured thickness of said resist film and with etching characteristics using said pattern of said resist film.

5. A method according to claim 1, wherein the exposure is controlled so that a line width of each one of said patterns transferred onto said resist film is equal to a line width of each other.

6. A wafer exposure apparatus comprising:
means for measuring the thicknesses of a portion of a resist film for each of a plurality of separate and discrete chip forming regions of a wafer;
means for exposing said resist film covering said wafer by a step and repeat method to transfer a pattern to each of the chip forming regions; and
means for controlling the exposure of said chip forming regions on the basis of the measured thickness of said resist film of the chip forming regions during transfer of said pattern.

7. An apparatus according to claim 6, wherein the thickness of said resist film is measured by sensing a phase difference of reflected light when said wafer is irradiated with light, 8. An apparatus according to claim 6, wherein the exposure of said resist film on said wafer is controlled in accordance with a measured thickness of said resist film and with developing characteristics of said resist film.

9. An apparatus according to claim 6, wherein the exposure of said resist film on said wafer is performed in accordance with a measured thickness of said resist film and with etching characteristics of said pattern of said resist film.

10. An apparatus according to claim 6, wherein the exposure is controlled so that a line width of each one of said patterns transferred onto said resist film is equal to a line width of each other.

11. A method according to claim 1, wherein the same pattern is transferred to the chip forming regions of the wafer.

12. An apparatus according to claim 6, wherein the same pattern is transferred onto the chip forming regions of the wafer.

* * * * *